(12) United States Patent
Schult et al.

(10) Patent No.: US 10,238,013 B2
(45) Date of Patent: Mar. 19, 2019

(54) COOLING SYSTEM FOR COOLING ELECTRONIC AIRCRAFT EQUIPMENT, AIRCRAFT EQUIPPED WITH A COOLING SYSTEM FOR COOLING ELECTRONIC AIRCRAFT EQUIPMENT AND METHOD FOR COOLING ELECTRONIC AIRCRAFT EQUIPMENT

(71) Applicant: Airbus Operations GmbH, Hamburg (DE)

(72) Inventors: Jens Schult, Hamburg (DE); J. Stephen M Whyte, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 15/638,684

(22) Filed: Jun. 30, 2017

(65) Prior Publication Data

US 2018/0007813 A1  Jan. 4, 2018

(30) Foreign Application Priority Data

Jul. 4, 2016  (EP) .................................... 16177716

(51) Int. Cl.
*G05D 23/00* (2006.01)
*H05K 7/20* (2006.01)
*B64D 45/00* (2006.01)
*B64D 13/06* (2006.01)

(52) U.S. Cl.
CPC ......... *H05K 7/20863* (2013.01); *B64D 45/00* (2013.01); *H05K 7/207* (2013.01); *H05K 7/20145* (2013.01); *H05K 7/20209* (2013.01); *H05K 7/20563* (2013.01); *B64D 2013/0614* (2013.01); *B64D 2045/009* (2013.01)

(58) Field of Classification Search
CPC ............ B64D 45/00; B64D 2013/0614; B64D 2045/009; H05K 7/20863; H05K 7/20145; H05K 7/20209; H05K 7/20563; H05K 7/207
USPC ........................................................ 165/294
See application file for complete search history.

(56) References Cited

U.S. PATENT DOCUMENTS

| 5,261,243 A | 11/1993 | Dunsmore |
| 2003/0053293 A1 | 3/2003 | Beitelmal et al. |
| 2007/0086158 A1* | 4/2007 | Hartung ............. H05K 7/20563 361/690 |

OTHER PUBLICATIONS

European Search Report, dated Dec. 9, 2016, priority document.

* cited by examiner

*Primary Examiner* — Davis D Hwu
(74) *Attorney, Agent, or Firm* — Greer, Burns & Crain Ltd.

(57) ABSTRACT

A cooling system for cooling electronic aircraft equipment comprises a primary cooling arrangement configured to provide basic cooling energy for cooling the electronic aircraft equipment and a supplemental cooling arrangement configured to provide supplemental cooling energy for cooling the electronic aircraft equipment. The supplemental cooling arrangement comprises a coolant supply system and a coolant distribution system. The coolant supply system is configured to supply a compressed coolant to the electronic aircraft equipment to be cooled, and the coolant distribution system is configured to selectively direct the compressed coolant supplied by the coolant supply system to at least one of a plurality of components of the electronic aircraft equipment.

17 Claims, 4 Drawing Sheets

COOLING SYSTEM FOR COOLING ELECTRONIC AIRCRAFT EQUIPMENT, AIRCRAFT EQUIPPED WITH A COOLING SYSTEM FOR COOLING ELECTRONIC AIRCRAFT EQUIPMENT AND METHOD FOR COOLING ELECTRONIC AIRCRAFT EQUIPMENT

CROSS-REFERENCES TO RELATED APPLICATIONS

This application claims the benefit of the European patent application No. 16177716.4 filed on Jul. 4, 2016, the entire disclosures of which are incorporated herein by way of reference.

BACKGROUND OF THE INVENTION

The present invention relates to a cooling system for cooling electronic aircraft equipment, an aircraft equipped with such a cooling system and a method for cooling electronic aircraft equipment.

Modern aircraft are subjected to an increasing demand of power electronic functions due to performance improvements and weight saving advantages provided by such technology. These power electronic functions, such as avionics or cabin management system functions, are typically allocated to electronic aircraft equipment. As a result, the number and power density of electronic equipment arranged in modern aircraft is increasing.

This technology depends on appropriate cooling systems for ensuring reliable performance of the electronic aircraft equipment. Specifically, these cooling systems are configured to provide cooling energy so as to ensure that a temperature of the electronic aircraft equipment to be cooled does not exceed a threshold value which would cause a loss or a failure of the corresponding functions. Examples of known cooling systems include active cooling systems, either in forced air or liquid form, or conductive cooling systems, e.g., by means of heat sinks. Due to the increasing power density of electronic equipment, however, the use of active cooling systems becomes more important as these cooling systems provide high cooling capacities.

For ensuring operability of the aircraft, these cooling systems are typically employed with a cooling capacity which is greater than is needed for the vast majority of the operational time of the aircraft. For example, there is typically a high demand for cooling of the electronic aircraft equipment when the aircraft is operated on ground. However, during flight, where temperatures are reduced due to altitude, the cooling requirements of the cooling system are correspondingly reduced. In other words, for safety reasons, these cooling systems are typically oversized and redundant. Because such cooling systems thereby add significant weight and complexity to the aircraft, they offset the weight saving advantages provided by this technology.

SUMMARY OF THE INVENTION

The invention is directed at an objective of providing an efficient and relatively light weight cooling system for cooling electronic aircraft equipment. Further, the invention is directed at an objective of providing an aircraft equipped with a cooling system of this kind and a method for cooling electronic aircraft equipment.

A cooling system for cooling electronic aircraft equipment comprises a primary cooling arrangement and a supplemental cooling arrangement, which are configured to provide cooling energy for cooling the electronic aircraft equipment, respectively.

The proposed cooling system may be used in any aircraft which is equipped with electronic aircraft equipment. The electronic aircraft equipment may be any electronic circuity and/or electrical or electronical components used in aircraft. The electronic aircraft equipment comprises a plurality of components to be cooled. Preferably, the electronic aircraft equipment comprises a plurality of power and/or computer modules which may be mounted to a rack, i.e., a so-called "module rack." The electronic aircraft equipment may comprise different functions, e.g., power electronic applications, which may be allocated to at least one of the plurality of modules of the electronic aircraft equipment. Such functions may include cabin management system functions and/or avionics functions, such as flight control, navigation, etc. Accordingly, the electronic aircraft equipment may be a cabin management or an avionics system.

The primary cooling arrangement is configured to provide basic cooling energy for cooling the electronic aircraft equipment. The primary cooling arrangement may be provided as an active cooling arrangement using either forced air or liquid as a coolant, or as a conductive cooling arrangement using one or more heat sinks. In particular, the primary cooling arrangement may be configured to provide cooling energy for each of the plurality of components of the electronic aircraft equipment. In other words, the primary cooling arrangement may be configured to provide cooling energy for the electronic aircraft equipment on an electronic aircraft equipment level, i.e., on a rack level of the electronic equipment.

As already described above, a cooling capacity for cooling electronic aircraft equipment, which is required to ensure operability of the electronic aircraft equipment, usually varies in dependence on the operational state of the aircraft. For example, due to reduced temperatures at higher altitudes, cooling requirements for the electronic aircraft equipment during ground operations of the aircraft are significantly higher than during in-flight operations. In other words, during ground operations of the aircraft, the required cooling capacity provided by the cooling system is higher than during in-flight operations. Further, for safety reasons, the cooling system must be provided with a spare cooling capacity. However, this spare cooling capacity of the cooling system may only be provided in case of a failure of the cooling system or the electronic aircraft equipment to be cooled. Thus, during normal operation, the spare cooling capacity typically is not provided by the cooling system.

The primary cooling arrangement is configured to provide basic cooling energy for cooling electronic aircraft equipment. The term "basic cooling energy" refers to a basic amount of cooling energy for cooling the electronic aircraft equipment that is required for the vast majority of the operational time or operational states of the aircraft. In other words, the primary cooling arrangement may be configured to provide a basic cooling capacity that satisfies a basic demand of cooling energy of the electronic aircraft equipment. This basic demand of cooling energy of the electronic aircraft equipment may remain constant during the vast majority of the operational time or operational states of the aircraft. For example, the basic cooling capacity of the primary cooling arrangement may be 80% of a maximum cooling capacity which can be provided by the cooling system. Alternatively, the basic cooling capacity of the primary cooling arrangement may be greater or lower than 80% of the maximum cooling capacity which can be provided by the cooling system.

Accordingly, the supplemental cooling arrangement is configured to provide supplemental cooling energy for cooling the electronic aircraft equipment. The term "supplemental cooling energy" refers to an amount of cooling energy which is provided supplemental to the basic cooling energy provided by the primary cooling arrangement. For example, the cooling capacity of the supplemental cooling arrangement may correspond to a spare cooling capacity of the cooling system. As a result, by providing a supplemental cooling arrangement, the proposed cooling system allows the use of a primary cooling arrangement with reduced cooling capacity, thereby reducing weight and costs thereof.

Specifically, the supplemental cooling arrangement may be configured to provide a supplemental cooling capacity in case of a peak cooling demand, i.e., a cooling demand of the electronic aircraft equipment to be cooled that exceeds the basic cooling demand. For example, such a peak cooling demand of the electronic aircraft equipment to be cooled may occur during ground operation of the aircraft.

Alternatively or additionally, the supplemental cooling arrangement may be configured to provide the supplemental cooling energy for cooling the electronic aircraft equipment in case of a state of failure of the cooling system and/or the electronic aircraft equipment. Specifically, such a state of failure of the cooling system may occur in case the primary cooling arrangement does not work properly such that the provision of the cooling energy for cooling the electronic aircraft equipment provided by the primary cooling arrangement can no longer be ensured. On the other hand, a state of failure of the electronic aircraft equipment to be cooled may occur in case a heat build-up in one of the plurality of components of the electronic aircraft equipment excessively increases relative to a normal operation thereof. Accordingly, the supplemental cooling arrangement may be configured to substitute and/or support the primary cooling arrangement, at least for a limited period of time, in case of a state of failure of the cooling system and/or the electronic aircraft equipment.

The proposed cooling system, in this way, may provide an emergency cooling function that ensures the maintenance of, at least temporarily, the operability of the electronic aircraft equipment to be cooled in case of a failure of the primarily cooling arrangement and/or the electronic aircraft equipment to be cooled.

The supplemental cooling arrangement comprises a coolant supply system and a coolant distribution system. The coolant supply system is configured to supply a compressed coolant to the electronic aircraft equipment to be cooled. The coolant distribution system of the supplemental cooling arrangement is configured to selectively direct the compressed coolant supplied by the coolant supply system to at least one of a plurality of components of the electronic aircraft equipment. In this way, the provided cooling system allows to selectively direct the supplemental cooling energy on a component level of the electronic aircraft equipment. In other words, in case of a supplemental cooling demand of merely one of the plurality of components of the electronic aircraft equipment, the coolant distribution system avoids the supply of the compressed coolant and thus the supplemental cooling energy to all of the plurality of components of the electronic aircraft equipment. Thus, by selectively directing the compressed coolant to at least one of a plurality of components of the electronic aircraft equipment, the cooling system ensures an efficient and effective provision of cooling energy.

Preferably, the compressed coolant supplied by the coolant supply system includes an inert gas, in particular carbon dioxide and/or nitrogen. By using an inert gas as the coolant supplied by the coolant supply system, the supplemental cooling arrangement may further provide a fire extinguishing or fire suppression function. Accordingly, the supplemental cooling arrangement may be configured to supply the compressed coolant to the electronic aircraft equipment in order to extinguish or suppress a fire in the electronic aircraft equipment. Therefore, the supplemental cooling arrangement may also constitute a fire extinguishing or a fire suppression system.

The coolant supply system may comprise a coolant source for providing the coolant to be supplied to the electronic aircraft equipment. The coolant source may comprise a container suitable to store compressed coolant. A coolant supply control device may be connected to the coolant source and configured to control a supply of compressed coolant from the coolant source to the coolant distribution system.

The coolant supply control device may comprise a compressor configured to compress coolant provided by the coolant source.

The coolant source may comprise a pressurized storage tank for storing compressed coolant. Alternatively or additionally, the coolant supply control device may comprise a coolant supply control valve.

Specifically, the coolant distribution system may comprise a plurality coolant distribution lines connected to the coolant supply system, particularly the coolant supply control device. The plurality of coolant distribution lines may be configured to selectively direct the coolant supplied by the coolant supply system to the plurality of components of the electronic aircraft equipment. The coolant distribution system may be provided in such a way that each of the plurality of coolant distribution lines is assigned to at least one of the plurality of components of the electronic aircraft equipment. Accordingly, each of the plurality of coolant distribution lines may be configured to selectively direct compressed coolant supplied by the coolant supply system to one or more of the plurality of components of the electronic aircraft equipment. For example, two or more of the plurality of components of the electronic aircraft equipment may be disposed close to one another such that one of the coolant distribution lines is configured to direct the compressed coolant to the two or more components.

In a further development, the coolant distribution system may comprise a plurality of coolant distribution control valves. Each of the plurality of coolant distribution control valves may be disposed in one of the plurality of coolant distribution lines and configured to control the flow of compressed coolant through the coolant distribution line. In this way, the flow of compressed coolant through each of the plurality of coolant distribution lines may be controlled so as to ensure that the compressed coolant supplied by the coolant supply system is selectively directed to at least one of the plurality of components of the electronic aircraft equipment.

At least one of the plurality of components of the electronic aircraft equipment may comprise a local hot spot area. The local hot spot area refers to a portion of the component of the electronic equipment which is subjected to an increased heat build-up, particularly compared to other portions thereof. Thus, for further improving the efficiency and effectiveness of the provided cooling system, at least one of the plurality of coolant distribution lines may be configured to selectively direct the coolant supplied by the coolant supply system to the local hot spot area of the at least one of the plurality of components of the electronic aircraft equipment. The local hot spot area may refer to a position of an element provided in the component of the electric aircraft equipment. Such an element may be a heat-sensitive element. For example, the element may be provided in the form of a power switching device or a transistor. Accordingly, by selectively directing the compressed coolant to a local hot area of the component, the coolant distribution system provides cooling energy for cooling the electronic aircraft equipment on an element level of the plurality of components of the electronic aircraft equipment.

In a further development, at least one of the coolant distribution lines may comprise a nozzle arranged at a downstream end of the coolant distribution line. The term "downstream" refers to a flow direction of the coolant flowing through coolant distribution line. Preferably, the nozzle and/or the downstream end of the at least one of the coolant distribution lines is arranged in the vicinity of at least one of the plurality of components of the electronic aircraft equipment. The nozzle may be configured to selectively direct the compressed coolant discharge from the coolant distribution line to at least one of the plurality of components of the electronic aircraft equipment, particularly to a local hot spot area thereof. For example, the nozzle may be provided in the form of a spray nozzle configured to spray the coolant uniformly along at least a portion of the at least one of the plurality of components of the electronic aircraft equipment to be cooled. Alternatively, the nozzle may be designed to selectively discharge the coolant to the local hot spot area of the at least one of the plurality of components of the electronic aircraft equipment to be cooled.

Upon discharging the compressed coolant from the downstream end of the coolant distribution line or the nozzle arranged at the downstream end thereof, the coolant directed to the at least one of the plurality of components of the electronic aircraft equipment expands to a lower pressure and thus decreases its temperature. In this way, a temperature gradient between the at least one of the plurality of components of the electronic aircraft equipment to be cooled and the coolant discharged in the vicinity of the at least one of the plurality of components of the electronic aircraft equipment to be cooled is increased. This has the effect of improving the cooling function provided by the supplemental cooling arrangement.

The cooling system may further comprise a control unit configured to operate the supplemental cooling arrangement in response to at least one control parameter. Specifically, the control parameter may be transmitted to the control unit from a sensor device, such as a temperature sensor device. The control parameter may be indicative of a peak cooling demand and/or a state of failure of the cooling system and/or the electronic aircraft equipment to be cooled. The control unit may be configured to control the coolant supply system, particularly the coolant supply control device, and/or the coolant distribution system, particularly the plurality of coolant distribution control valves, in response to the control parameter. Specifically, the control unit may control the coolant supply system, particularly the coolant supply control device, and/or the coolant distribution system, particularly the plurality of coolant distribution control valves, such that, when the control parameter indicates a peak cooling demand and/or an state of failure of the cooling system and/or the electronic aircraft equipment to be cooled, the coolant supply system supplies compressed coolant to at least one of the plurality of components of the electronic aircraft equipment via the coolant distribution system, particularly via at least one of the plurality of coolant distribution lines.

In a further development, the control parameter may be indicative of a temperature of the electronic aircraft equipment and/or of a temperature of at least one of the plurality of components of the electronic aircraft equipment, particularly of at least one local hot spot area of at least one of the plurality of components of the electronic aircraft equipment. Accordingly, the control unit may be configured to control the coolant supply system, particularly the coolant supply control device, in response to the control parameter such that, when the control parameter exceeds a threshold value, the coolant supply system supplies compressed coolant to at least one of the plurality of components of the electronic aircraft equipment by the coolant distribution system, particularly by at least one of the plurality of coolant distribution lines. The threshold value may be a predefined threshold value which refers to a temperature indicating that the electronic aircraft equipment and/or at least one of the plurality of components of the electronic aircraft equipment need to be provided with supplemental cooling energy provided by the supplemental cooling arrangement of the cooling system.

Alternatively or additionally, the control unit may be configured to control the coolant distribution system, in particular the at least one of the plurality of coolant distribution control valves, in response to the control parameter such that, when the control parameter exceeds the threshold value, the coolant distribution system selectively directs compressed coolant supplied by the coolant supply system to at least one of the plurality of components of the electronic aircraft equipment, particularly via at least one of the plurality of coolant distribution lines.

An aircraft is equipped with the above-described cooling system for cooling electronic aircraft equipment.

A method for cooling electronic aircraft equipment comprises the step of providing basic cooling energy for cooling the electronic aircraft equipment by means of a primary cooling arrangement. The method further comprises the step of providing supplemental cooling energy for cooling the electronic aircraft equipment by means of a supplemental cooling arrangement. During operation of the supplemental cooling arrangement, a coolant supply system supplies the compressed coolant to the electronic aircraft equipment to be cooled and a coolant distribution system selectively directs the compressed coolant supplied by the coolant supply system to at least one of a plurality of components of the electronic aircraft equipment.

BRIEF DESCRIPTION OF THE DRAWINGS

Preferred embodiments of the invention will now be explained in greater detail with reference to the accompanying schematic drawings, in which.

DETAILED DESCRIPTION OF THE PREFERRED EMBODIMENTS

Figure 1:
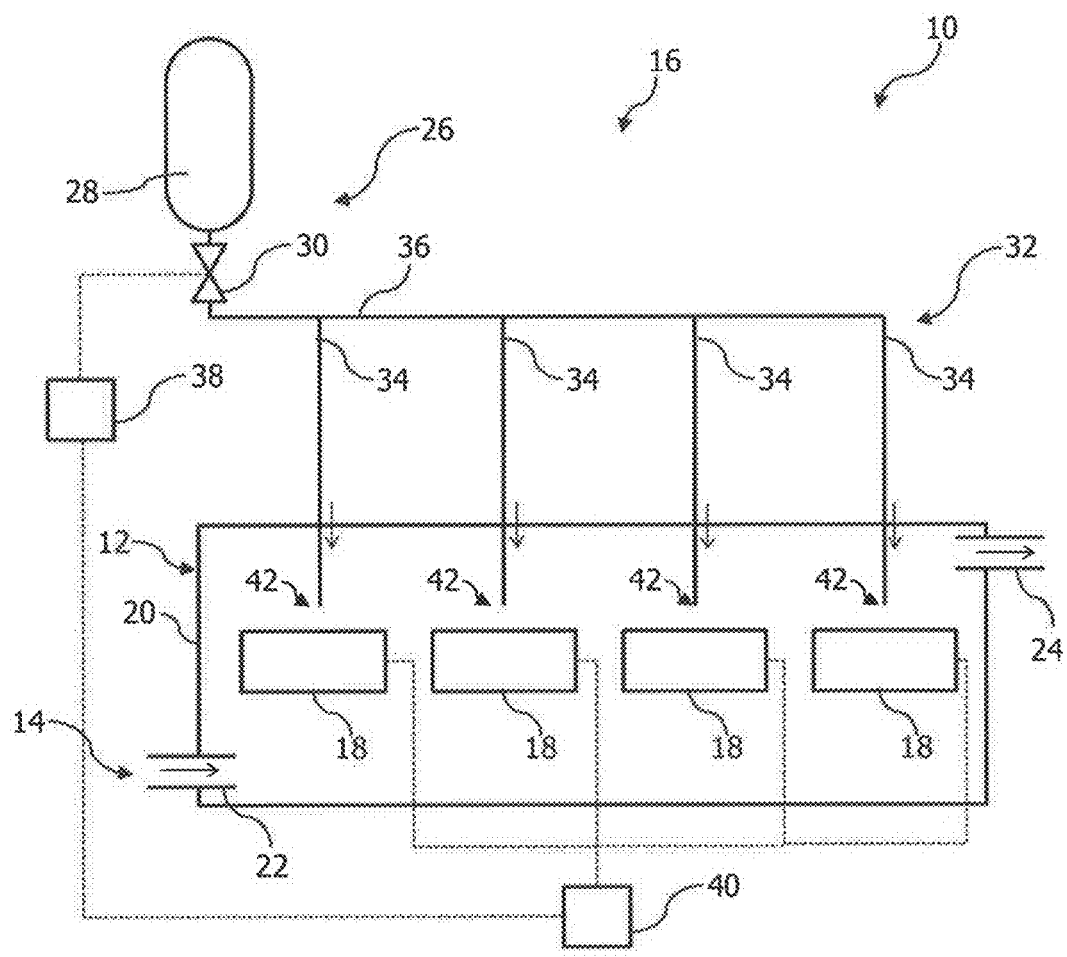
FIG. 1 shows a first embodiment of a cooling system for cooling electronic aircraft equipment installed in an aircraft.

FIG. 1 depicts a schematic drawing of a cooling system 10 for cooling electronic aircraft equipment 12 which is installed in an aircraft. The cooling system 10 comprises a primary cooling arrangement 14 and a supplemental cooling arrangement 16. The electronic aircraft equipment 12 to be cooled comprises a plurality of components 18 arranged in a housing 20 of the electronic aircraft equipment 12.

The primary cooling arrangement 14 is configured to provide basic cooling energy for cooling the electronic aircraft equipment 12, particularly the plurality of components 18 of the electronic aircraft equipment 12. Specifically, the primary cooling arrangement 14 is provided in the form of a forced air cooling arrangement having a supply line 22 for supplying chilled air into the housing 20 of the electronic aircraft equipment 12 and a discharge line 24 for discharging air from the housing 20 of the electronic aircraft equipment 12. Thus, chilled air supplied into the housing 20 of the electronic aircraft equipment 12 via the supply line 22 flows through the housing 20 of the electronic aircraft equipment 12, particularly over surfaces of the plurality of components 22 of the electronic aircraft equipment 12, and thereafter is discharged from the housing 20 via the discharge line 20. In this way, upon flowing through the electronic aircraft equipment 12 and over the surface of the plurality of components 18, the chilled air supplied into the housing 20 of the electronic aircraft equipment 12 via the supply line 18 cools the electronic aircraft equipment 12 and thereby provides the basic cooling energy.

In other words, the primary cooling arrangement 14 is configured to provide a basic cooling capacity for cooling the electronic aircraft equipment 12. This basic cooling capacity satisfies a basic cooling demand of the electronic aircraft equipment 12 which remains constant during the vast majority of operational time or operational states of the aircraft.

The supplemental cooling arrangement 16 is configured to provide supplemental cooling energy for cooling the electronic aircraft equipment 12, particularly the plurality of components 18 of the electronic aircraft equipment 12. Specifically, the supplemental cooling arrangement 16 is configured to provide a supplemental cooling capacity which can be provided instead of and/or supplemental to the basic cooling capacity of the primary cooling arrangement 14.

A coolant supply system 26 of the supplemental cooling arrangement 16 is configured to supply a compressed coolant to the electronic aircraft equipment 12 to be cooled. Preferably, the coolant supplied by the coolant supply system 26 includes an inert gas, in particular, carbon dioxide and/or nitrogen. The coolant supply system 26 comprises a coolant source 28 in form of a pressurized storage tank for storing the compressed coolant. A coolant supply control device 30 is connected to the coolant source 28 and configured to control the supply of compressed coolant from the coolant source 28 to a coolant distribution system 32 of the supplemental cooling arrangement 16. In this embodiment, the coolant supply control device 30 comprises a coolant supply control valve. Alternatively or additionally, the coolant supply control device 30 may comprise a compressor configured to compress coolant provided by the coolant source 28.

The coolant distribution system 32 is configured to selectively direct the compressed coolant supplied by the coolant supply system 26 to the plurality of components 18 of the electronic aircraft equipment 12. Specifically, the coolant distribution system 32 comprises a plurality of coolant distribution lines 34, each of which is connected to the coolant supply control device 30 of the coolant supply system 26 via a coolant supply line 36. The plurality of coolant distribution lines 34 is configured to discharge the compressed coolant into the housing 20 of the electronic aircraft equipment 12 and to selectively direct the compressed coolant to one of the plurality of components 18 of the electronic aircraft equipment 12, respectively. In other words, each of the plurality of coolant distribution lines 34 is assigned to one of the plurality of components 18 of the electronic aircraft equipment 12, respectively, so as to selectively direct the compressed coolant to this component 18.

Upon discharging the compressed coolant from the coolant distribution system 32 via the plurality of coolant distribution lines 34, the coolant expands to a lower pressure and thus decreases its temperature. Specifically, the compressed coolant is discharged from the plurality of coolant distribution lines 34 such that the expanded and chilled coolant is directed to the plurality of components 18 of the electronic aircraft equipment 12 so as to flow over the surface of the components 18, thereby providing the supplemental cooling energy for cooling the electronic aircraft equipment 12. After flowing over the surface of the plurality of components 18 of the electronic aircraft equipment 12, the coolant is then discharged from the housing 20 of the electronic aircraft equipment 12 via the discharge line 24.

The cooling system 10 further comprises a control unit 38 connected to the coolant supply control device 30 and configured to operate the supplemental cooling arrangement 16 in response to at least one control parameter. The control parameter is transmitted to the control unit 38 via a sensor device 40. Specifically, the sensor device 40 is a temperature sensor device connected to each of the plurality of components 18 of the electronic aircraft equipment 12 and configured to receive a temperature of each of the plurality of components 18 of the electronic aircraft equipment 12. Thus, the control parameter is indicative of a temperature of each of the plurality of components 18 of the electronic aircraft equipment 12.

More specifically, the control unit 38 is configured to control the coolant supply control device 30 in response to the control parameter such that, when the control parameter exceeds a threshold value, the coolant supply system 26 supplies compressed coolant to the plurality of components 18 of the electronic aircraft equipment 12 via the plurality of coolant distribution lines 34 of the coolant distribution system 32.

In other words, the control unit 38 is configured to monitor the control parameter indicative of the temperature of each of the plurality of components 18 of the electronic aircraft equipment 12. Thus, when the control parameter exceeds the threshold value, i.e., when the temperature of one of the plurality of components 18 of the electronic aircraft equipment 12 exceeds the threshold value, the control unit 38 identifies a supplemental cooling demand. This supplemental cooling demand, for example, may be indicative of a peak cooling demand and/or a state of failure of the cooling system 10 and/or the electronic aircraft equipment 12 to be cooled. Preferably, in case the control unit 38 indicates the supplemental cooling demand, both the primary cooling arrangement 14 and the supplemental cooling arrangement 16 provide cooling energy for cooling the electronic aircraft equipment 12.

Figure 2:
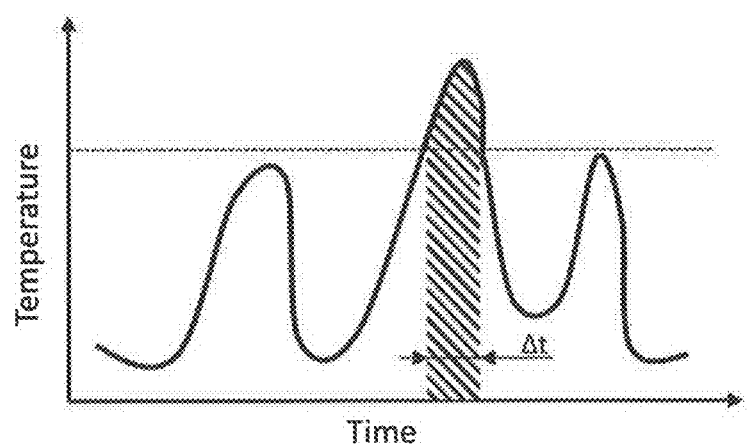
FIG. 2 shows a diagram of a heat load profile of the electronic aircraft equipment to be cooled.

FIG. 2 depicts a graph of a heat load profile of the electronic aircraft equipment 12, particularly of one of the plurality of components 18 of the electronic aircraft equipment 12. Specifically, the graph illustrates the time dependent temperature of one of the plurality of components 18 of the electronic aircraft equipment 12, wherein the abscissa in the graph shows the time and the ordinate in the graph shows the control parameter transmitted by the sensor device 40 indicative of the temperature thereof. Further, the threshold value for the control parameter is indicated by means of a dotted horizontal line. In FIG. 2, an area of the graph is shaded, in which the control parameter indicating the temperature exceeds the threshold value. This shaded area indicates a supplemental cooling demand of the cooling system 10. Therefore, for the period of time Δt of the shaded area, the control unit 38 controls the coolant supply control device 30 such that the coolant supply system 26 supplies compressed coolant to the plurality of components 18 of the electronic aircraft equipment 12 via the plurality of coolant distribution lines 34. However, thereafter, when the control parameter is again below the threshold value, the control unit 38 controls the coolant supply control device 30 so as to shut off the supply of compressed coolant to the plurality of components 18 of the electronic aircraft equipment 12.

Figure 3:
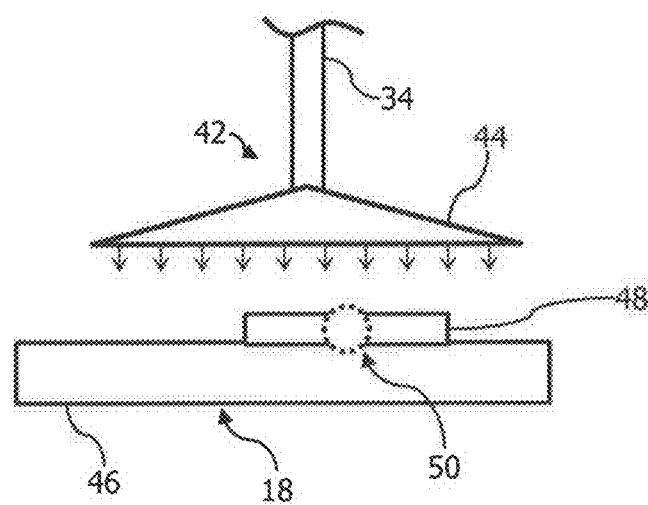
FIG. 3 shows an enlarged detail of the cooling system of FIG. 1.

FIG. 3 shows an enlarged detail of a downstream end 42 of one of the plurality of coolant distribution lines 34 of the cooling system 10 of FIG. 1. As shown in FIG. 3, the coolant distribution line 34 comprises a nozzle 44 arranged at the downstream end 42 of the coolant distribution line 34 and configured to selectively direct the compressed coolant discharged from the coolant distribution line 34 to one of the plurality of components 18 of the electronic aircraft equipment 12. Specifically, the component 18 of the electronic aircraft equipment 12 depicted in FIG. 3 comprises a power switching device 46 and a transistor 48, wherein the transistor 48 comprises a local hot spot area 50. The nozzle 44 is provided in the form of a spray nozzle arranged in the vicinity of the component 18 of the electronic aircraft equipment 12 to be cooled and configured to spray the coolant uniformly over a surface portion of the component 18 comprising the transistor 48 with the hot spot area 50.

Figure 4:
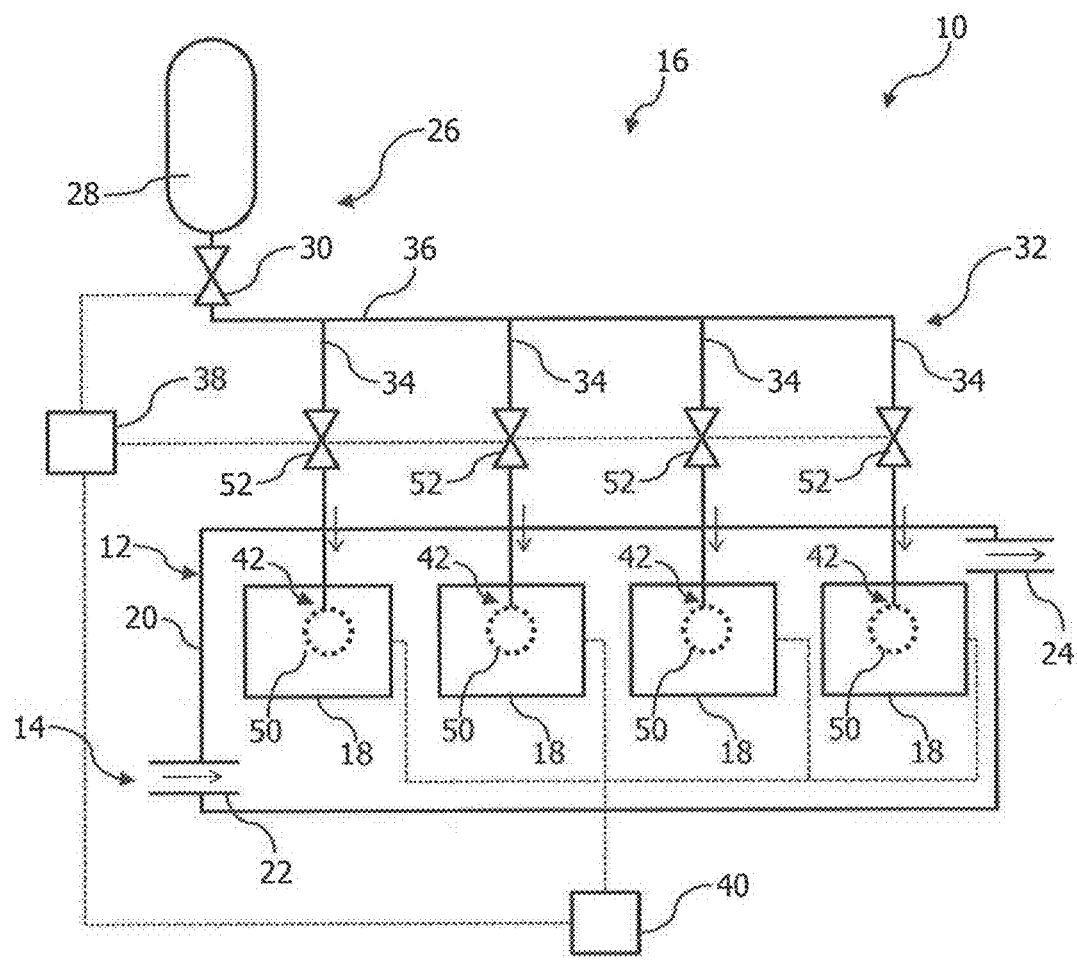
FIG. 4 shows a second embodiment of the cooling system for cooling electronic aircraft equipment.

FIG. 4 shows a further embodiment of the cooling system 10 for cooling aircraft equipment 12. In this embodiment, compared to the cooling system 10 depicted in FIG. 1, the coolant distribution system 32 comprises a plurality of coolant distribution control valves 52 each being disposed in one of the plurality of coolant distribution lines 34 and configured to control the flow of compressed coolant through the coolant distribution line 34. Further, each of the plurality of components 18 of the electronic aircraft equipment 12 comprises a local hot spot area 50, wherein the plurality of coolant distribution lines 34 is configured to selectively direct the coolant supplied by the coolant supply system 26 to the plurality of local hot spot areas 50 of the plurality of components 18 of the electronic aircraft equipment 12, respectively.

Accordingly, the control unit 38 is configured to control the coolant distribution system 32, particularly at least one of the plurality of coolant distribution control valves 52, in response to the control parameter such that, when the control parameter, i.e., the temperature of at least one of the plurality of components 18 of the electronic aircraft equipment 12 or a temperature of the plurality of hot spot areas 50 thereof, exceeds the threshold value, the coolant distribution system 32 selectively directs compressed coolant supplied by the coolant supply system 26 to at least one of the plurality of components 18 of the electronic aircraft equipment 12 via at least one of the plurality of coolant distribution lines 34. For example, if the control parameter indicates that the temperature of one of the plurality of components 18 of the electronic aircraft equipment 12 exceeds the threshold value, the control unit 38 controls the plurality of coolant distribution control valves 52 such that the compressed coolant supplied by the coolant supply system 26 is selectively directed to the component 18 of the electronic aircraft equipment 12 which temperature exceeds the threshold value.

Figure 5:
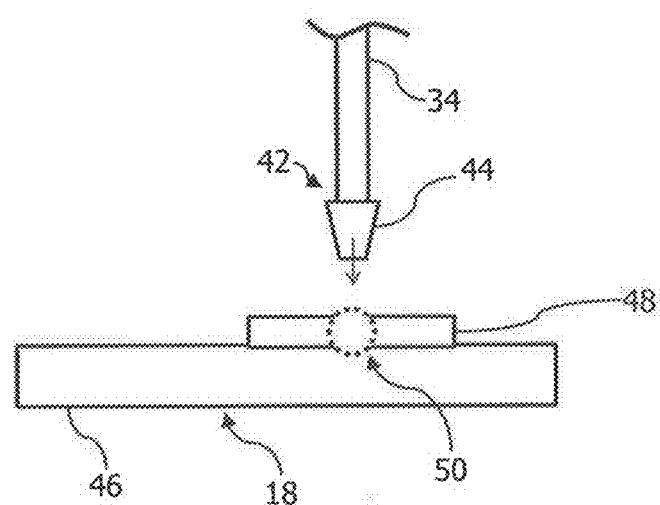
FIG. 5 shows an enlarged detail of the cooling system of FIG. 4.

FIG. 5 shows an enlarged detail of the downstream end 42 of one of the plurality of coolant distribution lines 34 of the cooling system 10 of FIG. 4. Compared to the embodiment depicted in FIG. 3, the nozzle 44 of this embodiment is configured to selectively discharge the coolant supplied by the coolant supply system to the local hot spot area 50 of the component 18 of the electronic aircraft equipment 12.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A cooling system for cooling electronic aircraft equipment, comprising:
 a primary cooling arrangement configured to provide basic cooling energy for cooling the electronic aircraft equipment; and
 a supplemental cooling arrangement configured to provide supplemental cooling energy for cooling the electronic aircraft equipment, wherein the supplemental cooling arrangement comprises:
  a coolant supply system configured to supply a compressed coolant to the electronic aircraft equipment to be cooled;
  a coolant distribution system configured to selectively direct the compressed coolant supplied by the coolant supply system to at least one of a plurality of components of the electronic aircraft equipment; and,
 a plurality of coolant distribution lines connected to the coolant supply system, each line configured to selectively direct the coolant supplied by the coolant supply system to a different one of the components of the electronic aircraft equipment from the plurality of components of the electronic aircraft equipment.

2. The cooling system of claim 1, wherein the compressed coolant supplied by the coolant supply system comprises an inert gas.

3. The cooling system of claim 1, wherein the coolant supply system comprises:
 a coolant source for providing the coolant to be supplied to the electronic aircraft equipment; and a coolant supply control device connected to the coolant source and configured to control a supply of compressed coolant from the coolant source to the coolant distribution system.

4. The cooling system of claim 3, wherein the coolant supply control device comprises a compressor configured to compress coolant provided by the coolant source.

5. The cooling system of claim 3, wherein the coolant source comprises a pressurized storage tank for storing compressed coolant.

6. The cooling system of claim 3, wherein the supply control device comprises a coolant supply control valve.

7. The cooling system of claim 1, wherein the coolant distribution system comprises a plurality of coolant distribution control valves each being disposed in one of the plurality of coolant distributions lines and configured to control a flow of compressed coolant through the coolant distribution line.

8. The cooling system of claim 1, wherein at least one of the plurality of components of the electronic aircraft equipment comprises a local hot spot area, and wherein at least one of the plurality of coolant distribution lines is configured to selectively direct the coolant supplied by the coolant supply system to the local hot spot area of the at least one of the plurality of components of the electronic aircraft equipment.

9. The cooling system of claim 1, wherein at least one of the coolant distribution lines comprises a nozzle arranged at a downstream end of the coolant distribution line and configured to selectively direct the compressed coolant discharged from the coolant distribution line to at least one of the plurality of components of the electronic aircraft equipment.

10. The cooling system of claim 1, further comprising a control unit configured to operate the supplemental cooling arrangement in response to at least one control parameter transmitted to the control unit from a sensor device, the control parameter being indicative of at least one of a peak cooling demand and a state of failure of at least one of the cooling system and the electronic aircraft equipment to be cooled.

11. The cooling system of claim 10, wherein the control unit is configured to control the coolant supply system in response to the control parameter such that, when the control parameter indicates at least one of a peak cooling demand and a state of failure of at least one of the cooling system and the electronic aircraft equipment to be cooled, the coolant supply system supplies compressed coolant to at least one of the plurality of components of the electronic aircraft equipment via the coolant distribution system.

12. The cooling system of claim 10, wherein the control parameter is indicative of a temperature of the electronic aircraft equipment and a temperature of at least one of the plurality of components of the electronic aircraft equipment.

13. The cooling system of claim 12, wherein the control unit is configured to control the coolant supply system in response to the control parameter such that, when the control parameter exceeds a threshold value, the coolant supply system supplies compressed coolant to at least one of the plurality of components of the electronic aircraft equipment via the coolant distribution system.

14. The cooling system of claim 12, wherein the control unit is configured to control the coolant distribution system such that, when the control parameter exceeds a threshold value, the coolant distribution system selectively directs compressed coolant supplied by the coolant supply system to at least one of the plurality of components of the electronic aircraft equipment.

15. An aircraft equipped with a cooling system according to claim 1.

16. A method for cooling electronic aircraft equipment, comprising:
providing basic cooling energy for cooling the electronic aircraft equipment by means of a primary cooling arrangement; and
providing supplemental cooling energy for cooling the electronic aircraft equipment with a supplemental cooling arrangement, including, during operation of the supplemental cooling arrangement, the steps of:
supplying a compressed coolant to the electronic aircraft equipment to be cooled by a coolant supply system; and
selectively directing the compressed coolant supplied by the coolant supply system to at least one of a plurality of components of the electronic aircraft equipment by a coolant distribution system, and,
wherein the supplemental cooling arrangement comprises a plurality of coolant distribution lines connected to the coolant supply system, each line configured to selectively direct the coolant supplied by the coolant supply system to a different one of the components of the electronic aircraft equipment from the plurality of components of the electronic aircraft equipment.

17. The cooling system of claim 2, wherein the inert gas comprises at least one of carbon dioxide or nitrogen.

* * * * *